(12) United States Patent
Lou et al.

(10) Patent No.: US 8,279,662 B2
(45) Date of Patent: Oct. 2, 2012

(54) MULTI-BIT MAGNETIC MEMORY WITH INDEPENDENTLY PROGRAMMABLE FREE LAYER DOMAINS

(75) Inventors: Xiaohua Lou, Milpitas, CA (US); Zheng Gao, San Jose, CA (US); Dimitar V. Dimitrov, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 63 days.

(21) Appl. No.: 12/944,523

(22) Filed: Nov. 11, 2010

(65) Prior Publication Data

US 2012/0120718 A1    May 17, 2012

(51) Int. Cl.
  *G11C 11/00* (2006.01)
(52) U.S. Cl. ......... 365/158; 365/148; 365/171; 977/935
(58) Field of Classification Search ............ 365/48, 365/55, 62, 66, 74, 78, 80–93, 100, 130, 365/131, 148, 158, 171–173, 209, 213, 225.5, 365/230.07, 232, 243.5; 216/22; 257/295, 257/421, E21.665; 438/3; 428/810–816, 428/817–825.1, 826; 977/933–935
See application file for complete search history.

(56) References Cited

U.S. PATENT DOCUMENTS

| | | | |
|---|---|---|---|
| 5,930,164 A | 7/1999 | Zhu | |
| 6,590,806 B1 | 7/2003 | Bhattacharyya | |
| 6,985,385 B2 | 1/2006 | Nguyen et al. | |
| 7,106,623 B2 | 9/2006 | Hung et al. | |
| 7,164,177 B2 | 1/2007 | Chang et al. | |
| 7,180,780 B1 | 2/2007 | Ho et al. | |
| 7,289,360 B2 | 10/2007 | Guterman et al. | |
| 7,301,800 B2 | 11/2007 | Frey | |
| 7,313,020 B2 | 12/2007 | Chae et al. | |
| 7,577,021 B2 | 8/2009 | Guo et al. | |
| 2003/0185050 A1* | 10/2003 | Kishi et al. | 365/173 |
| 2008/0243972 A1* | 10/2008 | Gaidis et al. | 708/130 |
| 2010/0033880 A1 | 2/2010 | Dimitrov et al. | |

* cited by examiner

*Primary Examiner* — Alexander Sofocleous
*Assistant Examiner* — Harry W Byrne
(74) *Attorney, Agent, or Firm* — Hall Estill Attorneys at Law

(57) ABSTRACT

An apparatus and associated method for a non-volatile memory cell, such as a multi-bit magnetic random access memory cell. In accordance with various embodiments, a magnetic tunnel junction (MTJ) has a ferromagnetic free layer with multiple magnetic domains that are each independently programmable to predetermined magnetizations. Those magnetizations can then be read as different logical states of the MTJ.

11 Claims, 5 Drawing Sheets

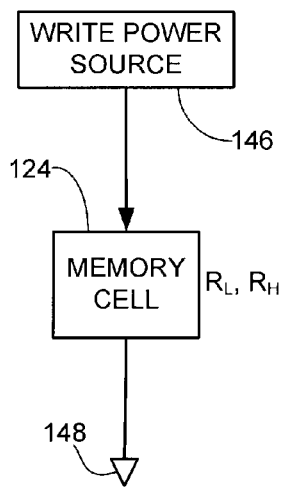
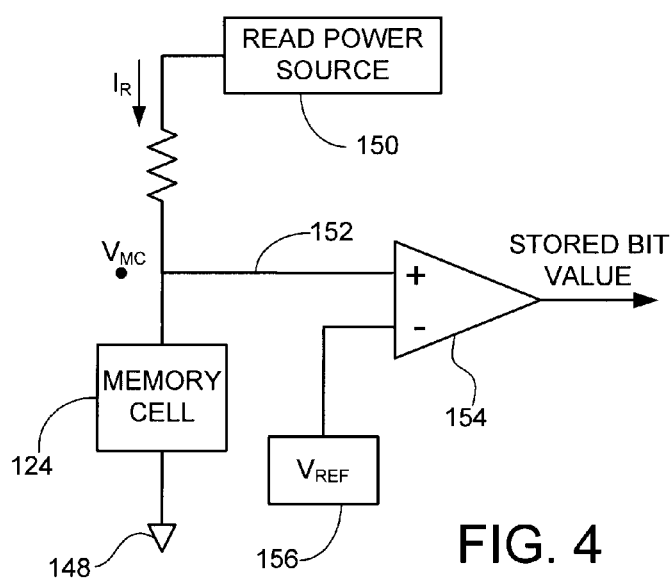
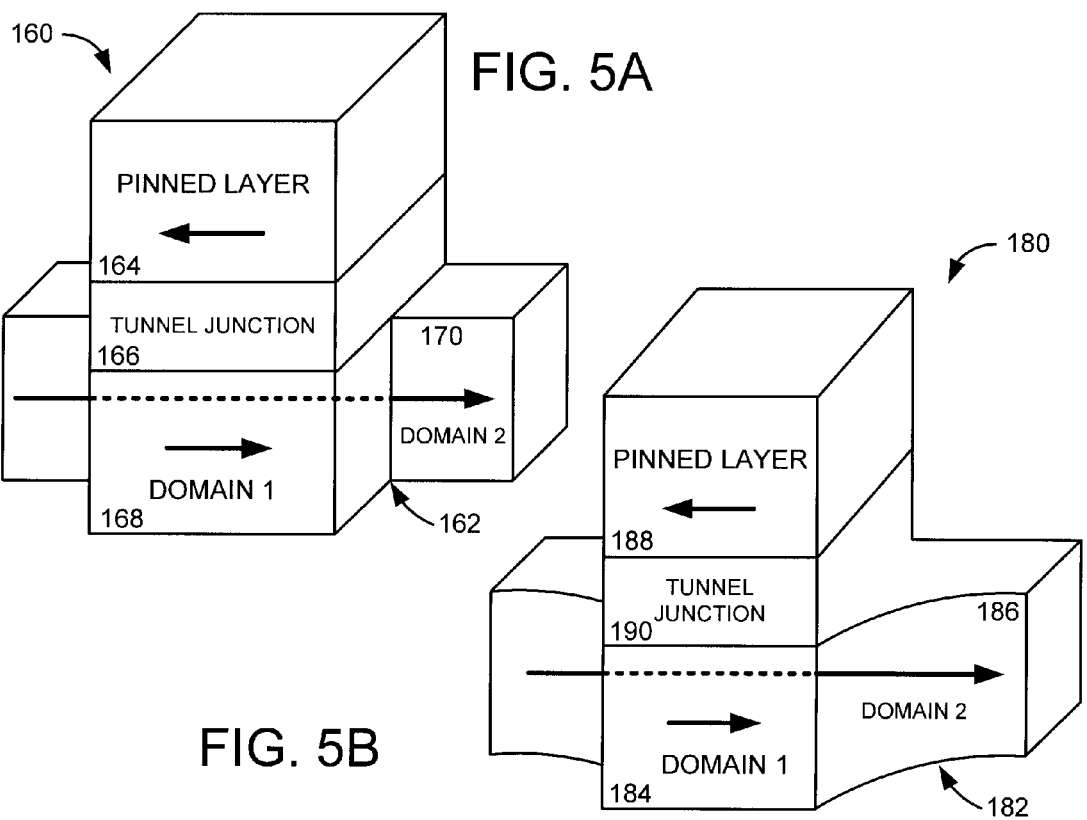

FIG. 6
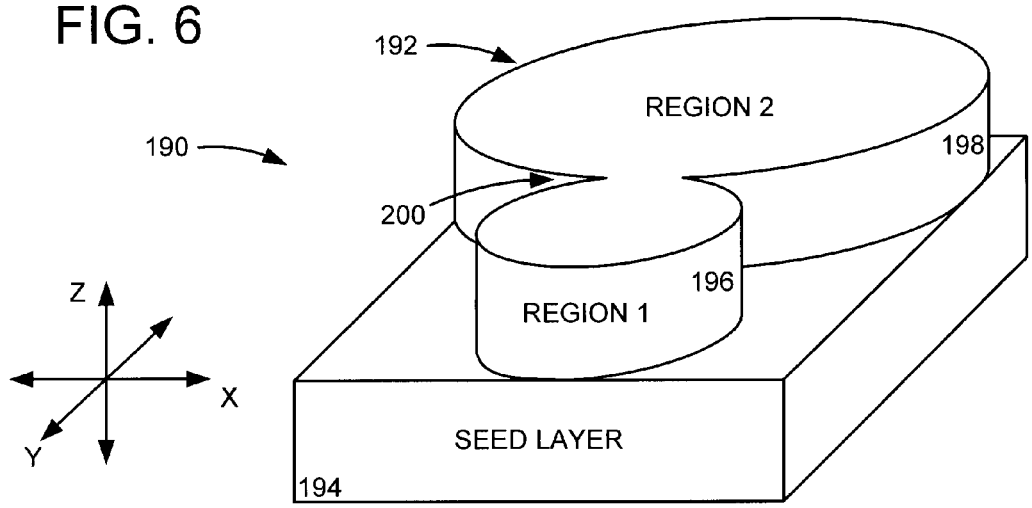
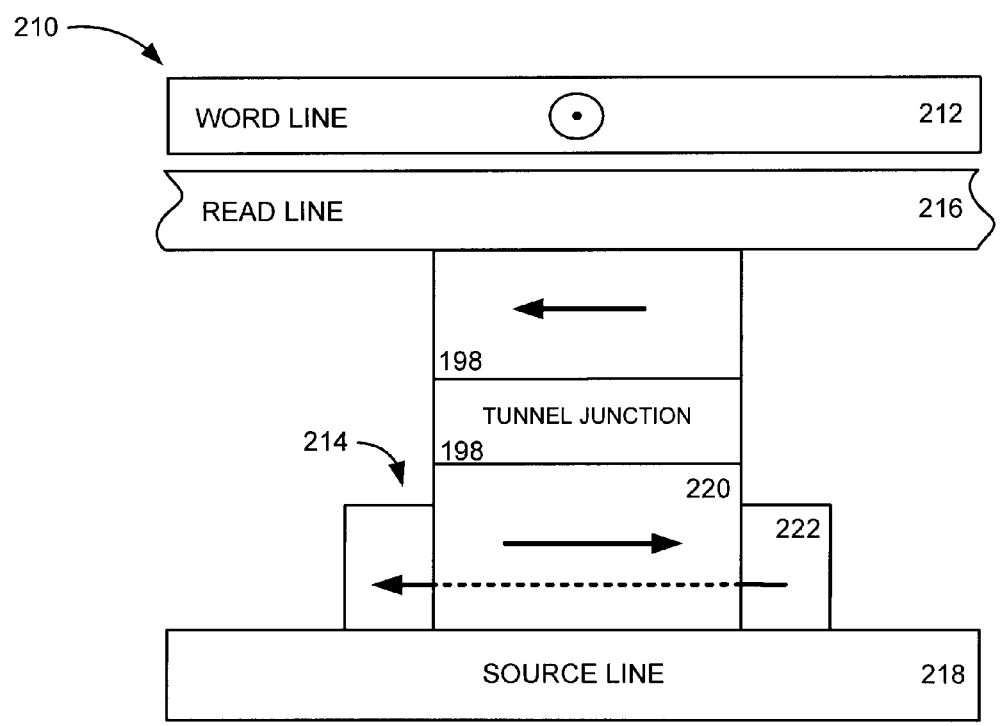
FIG. 7

MULTI-BIT MAGNETIC MEMORY WITH INDEPENDENTLY PROGRAMMABLE FREE LAYER DOMAINS

SUMMARY

Various embodiments of the present invention are generally directed to a multi-bit non-volatile memory cell configured to have independently programmable free layer domains.

In accordance with various embodiments, a magnetic tunnel junction (MTJ) has a ferromagnetic free layer with multiple magnetic domains that are each independently programmable to predetermined magnetizations. Those magnetizations can then be read as different logical states of the MTJ.

These and other features and advantages which characterize the various embodiments of the present invention can be understood in view of the following detailed discussion and the accompanying drawings.

BRIEF DESCRIPTION OF THE DRAWINGS

FIG. 3 generally illustrates a manner in which data can be written to a memory cell of the memory array.

FIG. 4 generally illustrates a manner in which data can be read from the memory cell of FIG. 3.

FIGS. 5A and 5B show exemplary memory cells constructed and operated in accordance with the various embodiments of the present invention.

FIG. 6 displays an isometric representation of a portion of an exemplary operational configuration of the memory cells of FIG. 5.

FIG. 7 illustrates an exemplary operational configuration of the memory cells of FIG. 5A.

DETAILED DESCRIPTION

The present disclosure generally relates to multi-bit non-volatile magnetic memory cells. Solid state non-volatile memory is a developing technology aimed at providing reliable data storage and faster data transfer rates in ever decreasing form factors. However, such solid state memory can have limited practical applications due to low cell density and large programming requirements. As data storage devices decrease in size, the large programming requirements can result in high volatility for adjacent cells, which corresponds with reduced memory cell readability and writeability.

Accordingly, a memory cell with a first magnetic tunnel junction (MTJ) with a ferromagnetic free layer having multiple magnetic domains that are each independently programmable to predetermined magnetizations provides increased cell density in combination with decreased programming requirements. The multiple magnetic domains allows for the storage of a plurality of magnetizations that, in relation to a pinned layer of the MTJ, can be read as multiple logical states. With such increased data capacity for a single MTJ, an array of numerous MTJs can provide enhanced integration densities for a variety of operations in data storage devices.

Figure 1:
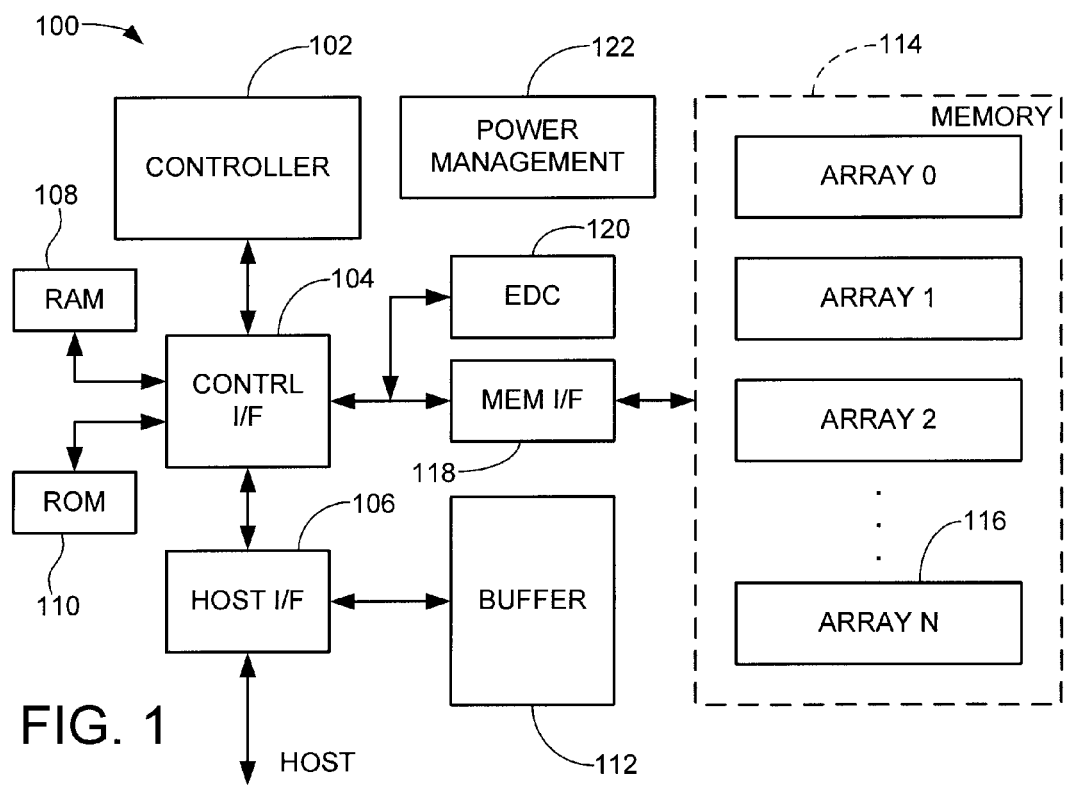
FIG. 1 is a generalized functional representation of an exemplary data storage device constructed and operated in accordance with various embodiments of the present invention.

FIG. 1 provides a functional block representation of a data storage device 100 constructed and operated in accordance with various embodiments of the present invention. The data storage device is contemplated as comprising a portable non-volatile memory storage device such as a PCMCIA card or USB-style external memory device. It will be appreciated, however, that such characterization of the device 100 is merely for purposes of illustrating a particular embodiment and is not limiting to the claimed subject matter.

Top level control of the device 100 is carried out by a suitable controller 102, which may be a programmable or hardware based microcontroller. The controller 102 communicates with a host device via a controller interface (I/F) circuit 104 and a host I/F circuit 106. Local storage of requisite commands, programming, operational data, etc. is provided via random access memory (RAM) 108 and read-only memory (ROM) 110. A buffer 112 serves to temporarily store input write data from the host device and readback data pending transfer to the host device.

A memory space is shown at 114 to comprise a number of memory arrays 116 (denoted Array 0-N), although it will be appreciated that a single array can be utilized as desired. Each array 116 comprises a block of magnetic semiconductor memory of selected storage capacity. Communications between the controller 102 and the memory space 114 are coordinated via a memory (MEM) I/F 118. As desired, on-the-fly error detection and correction (EDC) encoding and decoding operations are carried out during data transfers by way of an EDC block 120.

While not limiting, in some embodiments the various circuits depicted in FIG. 1 are arranged as a single chip set formed on one or more semiconductor dies with suitable encapsulation, housing and interconnection features (not separately shown for purposes of clarity). Input power to operate the device is handled by a suitable power management circuit 122 and is supplied from a suitable source such as from a battery, AC power input, etc. Power can also be supplied to the device 100 directly from the host such as through the use of a USB-style interface, etc.

Any number of data storage and transfer protocols can be utilized, such as logical block addressing (LBAs) whereby data are arranged and stored in fixed-size blocks (such as 512 bytes of user data plus overhead bytes for ECC, sparing, header information, etc). Host commands can be issued in terms of LBAs, and the device 100 can carry out a corresponding LBA-to-PBA (physical block address) conversion to identify and service the associated locations at which the data are to be stored or retrieved.

Figure 2:
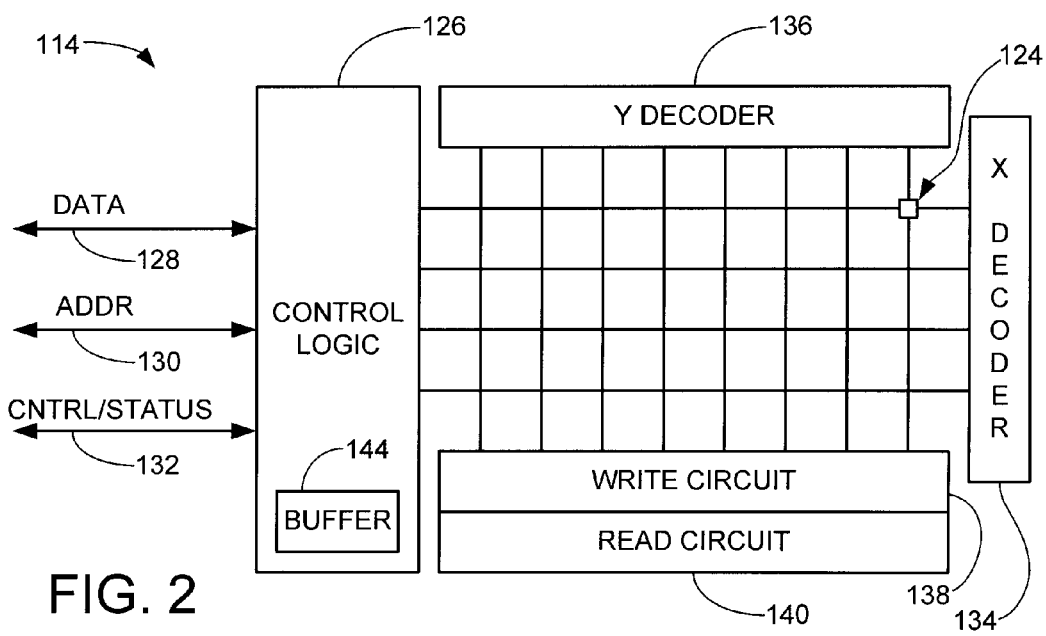
FIG. 2 shows circuitry used to read data from and write data to a memory array of the device of FIG. 1.

FIG. 2 provides a generalized representation of selected aspects of the memory space 114 of FIG. 1. Data are stored as an arrangement of rows and columns of memory cells 124, accessible by various row (word) and column (bit) lines. The actual configurations of the cells and the access lines thereto will depend on the requirements of a given application. Generally, however, it will be appreciated that the various control lines will generally include enable lines that selectively enable and disable the respective writing and reading of the value(s) of the individual cells.

Control logic 126 receives and transfers data, addressing information and control/status values along multi-line bus paths 128, 130 and 132, respectively. X and Y decoding circuitry 134, 136 provide appropriate switching and other functions to access the appropriate cells 124. A write circuit 138 represents circuitry elements that operate to carry out write operations to write data to the cells 124, and a read circuit 140 correspondingly operates to obtain readback data from the cells 124. Local buffering of transferred data and other values can be provided via one or more local registers 144. At this point it will be appreciated that the circuitry of FIG. 2 is merely exemplary in nature, and any number of alternative configurations can readily be employed as desired depending on the requirements of a given application.

Data are written to the respective memory cells 124 as generally depicted in FIG. 3. Generally, a write power source 146 applies the necessary input (such as in the form of current, voltage, magnetization, etc.) to configure the memory cell 124 to a desired state. It can be appreciated that FIG. 3 is merely a representative illustration of a bit write operation. The configuration of the write power source 146, memory cell 124, and reference node 148 can be suitably manipulated to allow writing of a selected logic state to each cell.

As explained below, in some embodiments the memory cell 124 takes a modified magnetic and spin-torque random access memory (MRAM and STRAM) configuration, in which case the write power source 146 is characterized as a current driver connected through a memory cell 124 to a suitable reference node 148, such as ground. The write power source 146 provides an electric current through a word line passing in the vicinity of the MRAM cell. The magnetic flux from the word line creates a magnetic field which changes the orientation of the magnetic moment of the memory cell 124.

Depending on the direction of the magnetic moment, the cell 124 may take either a relatively low resistance ($R_L$) or a relatively high resistance ($R_H$). While not limiting, exemplary $R_L$ values may be in the range of about 100 ohms ($\Omega$) or so, whereas exemplary $R_H$ values may be in the range of about 100 K$\Omega$ or so. These values are retained by the respective cells until such time that the state is changed by a subsequent write operation. While not limiting, in the present example it is contemplated that a high resistance value ($R_H$) denotes storage of a logical 1 by the cell 124, and a low resistance value ($R_L$) denotes storage of a logical 0.

The logical bit value(s) stored by each cell 124 can be determined in a manner such as illustrated by FIG. 4. A read power source 150 applies an appropriate input (e.g., a selected read voltage) to the memory cell 124. The amount of read current $I_R$ that flows through the cell 124 will be a function of the resistance of the cell ($R_L$ or $R_H$, respectively). The voltage drop across the memory cell (voltage $V_{MC}$) is sensed via path 152 by the positive (+) input of a comparator (sense amplifier) 154. A suitable reference (such as voltage reference $V_{REF}$) is supplied to the negative (−) input of the comparator 154 from a reference source 156.

The voltage reference $V_{REF}$ can be selected from various embodiments such that the voltage drop $V_{MC}$ across the memory cell 124 will be lower than the $V_{REF}$ value when the resistance of the cell is set to $R_L$, and will be higher than the $V_{REF}$ value when the resistance of the cell is set to $R_H$. In this way, the output voltage level of the comparator 154 will indicate the logical bit value (0 or 1) stored by the memory cell 124.

FIGS. 5A and 5B generally illustrate exemplary non-volatile memory cells 160 and 180 in accordance with various embodiments of the present invention. In FIG. 5A, memory cell 160 has a ferromagnetic free layer 162 and a magnetic pinned layer 164 separated by a tunnel junction 166. The free layer 162 is configured to have laterally adjacent first and second regions 168 and 170 that each have independent magnetic domains. As shown, the free layer 162 is a continuous layer of a common material that can be constructed as a single unit or as successive layers that develop independent domains that can be individually programmed and read due to each region 168 and 170 contacting the tunnel junction 166.

The free layer 162 can further be configured with predetermined dimensions and features that contribute to the retention of multiple stable independent domains. The first and second regions 168 and 170 can be constructed with different sizes and shapes to take advantage of shape anisotropy in maintaining the respective domains. Likewise, the regions 168 and 170 of the free layer 162 can have various features, such as orange-peel coupling and varying materials, that contribute to establishing different coercivities for the regions 168 and 170. The configuration of the free layer 162 with multiple magnetic domains may result in one or more domain walls being present between the regions 168 and 170 which can provide further independence for each magnetic domain.

As can be appreciated, the memory cell 160 is not limited to the orientation displayed in FIG. 5A. In fact, the various constituent layers can be moved and modified, as desired, to provide various operational characteristics with regard to the dual magnetic domains of the free layer 162. For example, the tunnel junction 166 can be modified in both size and material to allow various programming techniques, such as magnetic flux and spin torque current, to read and write a logical state to the memory cell 160. In some embodiments, the tunnel junction 166 is a MgO compound that allows for memory cell 160 to be programmed with spin torque current or magnetic flux.

Memory cell 180 of FIG. 5B illustrates how the shape and dimensions of the free layer 182 and the regions 184 and 186 can vary while still providing independent magnetic domains that contact the tunnel junction 190 and are individually programmable. The first and second regions 184 and 186 are modified from the regions 168 and 170 displayed in FIG. 5A and can be made in similar or dissimilar manners than regions 168 and 170. Specifically, the transition from the first region 184 to the second region 186 is continuously curvilinear, which contrasts the notched 90 degree transition of memory cell 160. Such curvilinear transition can extend radially about the free layer 182 and be configured to separate the magnetizations of the regions 184 and 186.

The dimensions of the regions 184 and 186 are also varied from the memory cell 160 by exaggerating the size of the second region 186 in comparison to the first region 184. The greater thickness and width can attribute to shape anisotropy and other magnetization stabilizers that aid in maintaining the independence of the respective magnetic domains. The variance in dimensions of the free layer 182 further configures the regions 184 and 186 with different coercivities that aid in programming two independent logical states to the cell 180. That is, a programming current of that is above a predetermined threshold value will set the magnetization of both regions while a current below that threshold value will set only the first region 184 due to the smaller coercivity.

As can be appreciated, the memory cells 160 and 180 each represent a magnetic tunneling junction (MTJ) portion of a complete memory cell that can include any number of other layers and materials, such as electrodes, seed layers, and control lines. Additionally, the pinned layers 164 and 188 of each respective memory cells 160 and 180 can be a single layer, such as an antiferromagnetic (AFM) material, lamination of layers, such as a synthetic antiferromagnetic structure, or combination of layers, such as an AFM coupled to a magnetic free layer, that maintains a preset magnetization in the presence of magnetic flux either above or below the predetermined threshold.

FIG. 6 isometrically displays a portion of an exemplary memory cell 190 in which a ferromagnetic free layer 192 has been deposited on a seed layer 194. The seed layer 194 can provide a surface to optimally grow or deposit the free layer 192 with first and second regions 196 and 198 that have different shapes and dimensions. As shown, each region 196 and 198 has a continuously curvilinear perimeter that meet in a narrowed throttle region 192 that minimizes magnetic interference between the independent magnetic domains of each region by localizing any domain walls to the throttle region 192.

The magnetic interference between the regions 196 and 198 is further inhibited by the difference in sizes of the respective regions. That is, the smaller surface area of the first region 196 compared to the second region 198 promotes individual magnetic domains that remain independent throughout various programming and reading operations. Such sizing of the regions 196 and 198 can correspond to varying resistances and magnetic coercivities that provide operational benefits in programming only a selected region.

While the free layer 192 has the regions 196 and 198 laterally adjacent, as measured along the X and Y axis, such configuration is not limited as the seed layer can be removed and the free layer be implemented into a memory cell, such as cell 180 of FIG. 5B, with the regions 196 and 198 vertically adjacent, as measured along the X and Z axis. Regardless of the lateral or vertical implementation, the shape and size characteristics of the free layer 192 provide dual magnetic domains with enhanced stability.

FIG. 7 generally illustrates a memory cell 210 that includes various control lines used to read and write logical states to and from the cell. The configuration of FIG. 7 is directed at providing a current flowing through a word line 212 that corresponds with a magnetic flux that sets the magnetization of one or both domains of a free layer 214. However, the cell 210 can be alternatively programmed with a current passing through the free layer 214 from the read line 216 to the source line 218. In some embodiments, magnetic flux from the word line programs the cell 210 and current from the read line 216 is used to read the programmed logical state.

In operation, if current passing through the cell 210 is below a predetermined threshold value, a first magnetic domain of a first region 220 of the free layer 214 is set while the second domain of the second region 222 remains unchanged. Such selective programming results from the difference in magnetic coercivity due to shape anisotropy and allows both domains to be programmed with a current that is above the predetermined threshold. Thus, one or both domains of the free layer 214 can be programmed by controlling the current passing through the cell 210.

The selective programming of the domains of the free layer 214 allows for multiple bits of data to be stored in the cell 210 as different logical states. Passing a read current through the cell 210 will output a resistance in relation to the pinned layer 224 that is separated from the free layer 214 by a tunnel junction 226. The read resistance will be one of a multiple of the number of domains in the free layer 214. In the cell 210, four possible resistances can be outputted by a read current depending on the orientation of each of the domains. As can be appreciated, as the number of independent domains and regions increase, higher amounts of data can be stored and outputted as more resistances.

While the memory cell 210 is not limited to the configuration shown in FIG. 7, the word line 212 extends, in some embodiments, along an axis that is perpendicular to the plane of the magnetic domains. As such, orienting the domains in either a horizontal plane, as shown in FIG. 7, or in a perpendicular plane, in which the domains vertically extend, provides a magnetic configuration that is perpendicular to the longitudinal axis of the word line 212.

Various other structural and operational modifications can be made to the cell 210. One such example is provided in FIG. 8 which displays an exemplary memory cell 230 that is configured to be both written and read with a current passing through the cell 230. In contrast to cell 210 of FIG. 7 which had a non-contacting word line 212 that controlled logical state programming, cell 230 has a single control line 232 that contacts the MTJ 234 and operates to provide both a reading and programming current. The current from the control line 232 can operate in concert with a selection current that activates the selection device 236 to complete the circuit between the control line and the source line 238.

The inclusion of the selection device 236 allows the cell 230 to be implemented in an array, like the cross-point array of FIG. 2, and be individually programmed or read, as desired. When read, the presence of dual independent magnetic domains in the MTJ 234 operates as two independent MTJs connected in parallel. That is, the multitude of independent magnetic domains in the free layer of the MTJ 234 practically acts as separate MTJs connected in parallel. Therefore, any read resistance in the cell 230 is evaluated to determine the programmed logical state of each independent magnetic domain by analyzing the output resistance with regard to a parallel connection, as opposed to a connection of MTJs in series.

Figure 8:
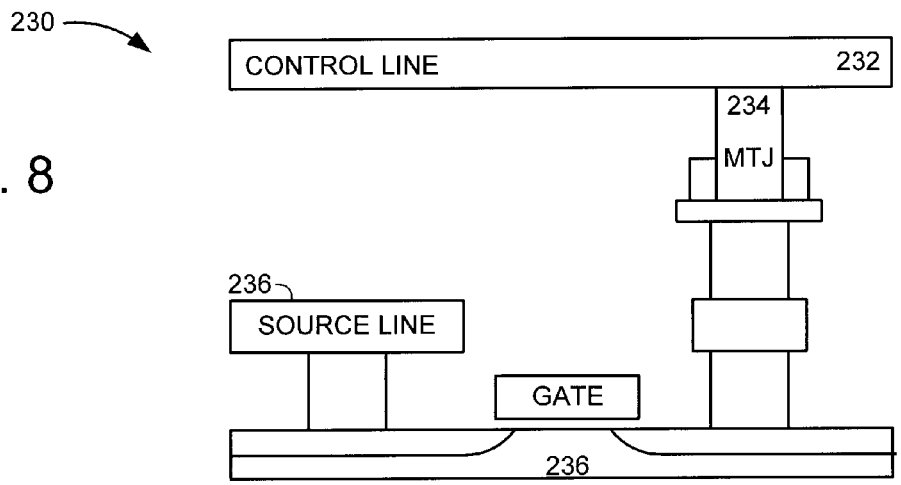
FIG. 8 provides a schematic diagram of an exemplary memory cell in accordance with various embodiments of the present invention.
Figure 9A:
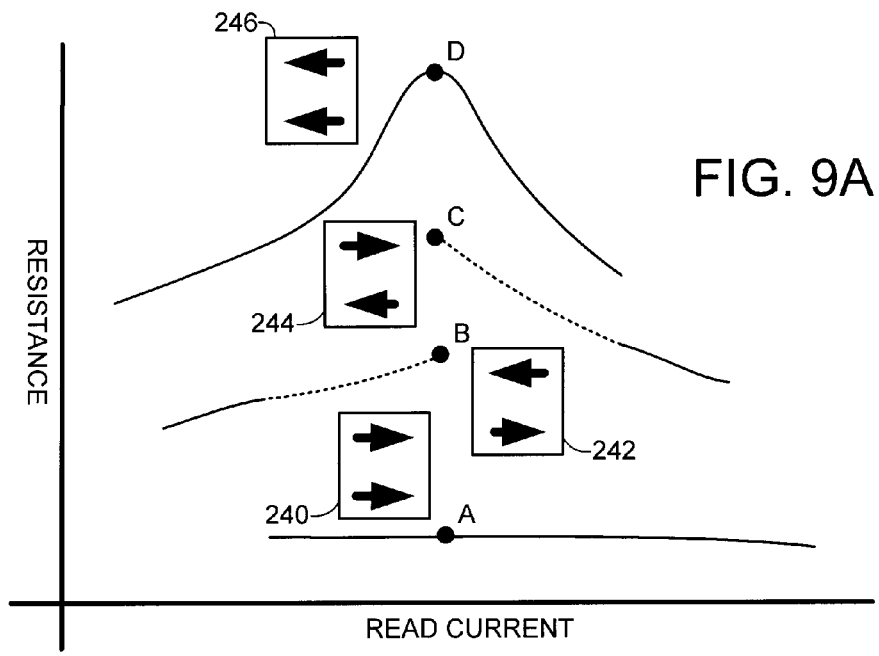
FIGS. 9A and 9B graph various operational characteristics of the memory cells of FIG. 5.
Figure 9B:
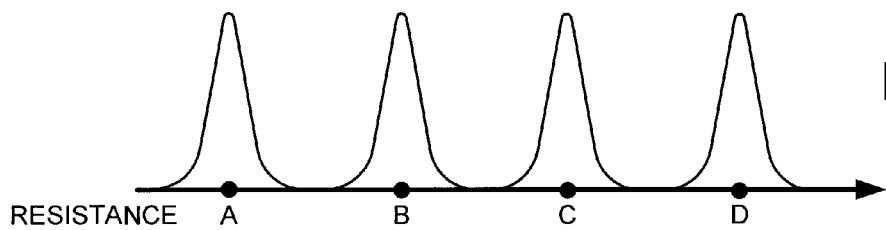

FIGS. 9A and 9B provide exemplary graphical representations of reading the logical state of a memory cell, such as the memory cells of FIGS. 5, 7, and 8. FIG. 9A is an operational graph of reading an exemplary memory cell with various logical states represented with reference to the required current and resistance. Depending on the logical state programmed to each of the independent magnetic domains of the free layer, the resistance of the cell, as outputted by the read current, will vary and identify the programmed magnetization of each domain.

The lowest output resistance of the cell corresponds with both domains being set in a common direction, as shown in free layer 240, that can be read at point A as a combined resistance that can be evaluated, with respect to the domains being connected in parallel, to determine the logical state of each domain. At point B, a higher resistance is experienced that corresponds with opposing magnetizations for the domains, displayed by free layer 242. Continuing with higher resistances, point C, represented by free layer 244, has opposing magnetizations in which the stronger of the two domains is set in a hard magnetic orientation as dictated by shape anisotropy of the free layer.

Point D similarly has both domains set to the hard magnetic orientation, as displayed in free layer 246, which non-coincidently corresponds to the highest possible read resistance for the cell. FIG. 9B illustrates the isolation of each logical state for a given resistance, which allows an output resistance to be evaluated to determine the magnetization of each domain. Without such resistance isolation, an output resistance would not reliably correspond to a particular magnetization of each domain.

While the various domain magnetizations can be determined with a common read current. Programming a magnetization to one or more of the domains can require using a current both above and below a predetermined threshold value, as discussed above. A flow chart of an exemplary cell operating routine 250 is displayed in FIG. 10.

The routine 250 begins by providing a ferromagnetic free layer 353 with individually programmable and independent magnetic domains, as generally illustrated by cell 352. It should be noted that the multiple domains of the cell 352 are denoted as arrows of different lengths and that the seed layer of cell 352 is optional and is not required to construct or operate the memory cell. That is, the length of the arrows illustrated in conjunction with routine 250 correspond to varying magnetic intensity, such as the different magnetization of the multiple domains due to shape anisotropy.

A tunnel barrier and pinned layer 355 are then deposited onto the free layer in step 254, as shown in cell 354. After step 254, an MTJ is formed that is capable of being programmed and read with either magnetic fields or currents passing through the free layer 353. Subsequent to step 254, decision 256 determines the desired magnetic orientations for each of the domains of the free layer. While the free layer 353 can be configured with more than two domains, the presence of two domains corresponds to four logical state combinations (01, 11, 10, and 00).

A determination of a "11" or "01" logical state combination in decision 256 advances to step 258 where a positive current above a predetermined threshold value is passed through the cell, as displayed in cell 358. Such a strong positive current generates a large enough magnetic flux to program both domains of the free layer to a "1" logical state. If a "01" combination was desired from decision 256, step 260 passes a negative current below a predetermined threshold value through the free layer 353, which sets the magnetization of one domain while not affecting the magnetization of the other domain. In some embodiments, the programmed domain in step 260 corresponds to a smaller portion of the free layer 353 that has a lower magnetic coercivity, as shown by cell 360.

As can be appreciated, the use of "positive" and "negative" currents is strictly related to the direction of current flow through the word line and in no way requires that current have a negative value. As shown by cell 348, a negative current and the corresponding negative magnetic flux merely flows in an opposite direction in relation to a positive current and flux.

The routine 250 can advance to a different memory cell and begin again, or the same cell provided in step 254 can return to decision 256 to be reprogrammed to a different logical state combination after step 260. In the event that "00" or "10" are desired logical state combinations, the routine 250 proceeds from decision 256 to step 262 where a negative current above the predetermined threshold is generated, as shown in cell 362, to program both MTJs to a 0 logical state. The further passage of a positive current below the predetermined threshold value is conducted in step 264 to program the one of the domains of the free layer 353 to a 1 logical state while the other domain remains unchanged, as illustrated in cell 364.

Figure 10:
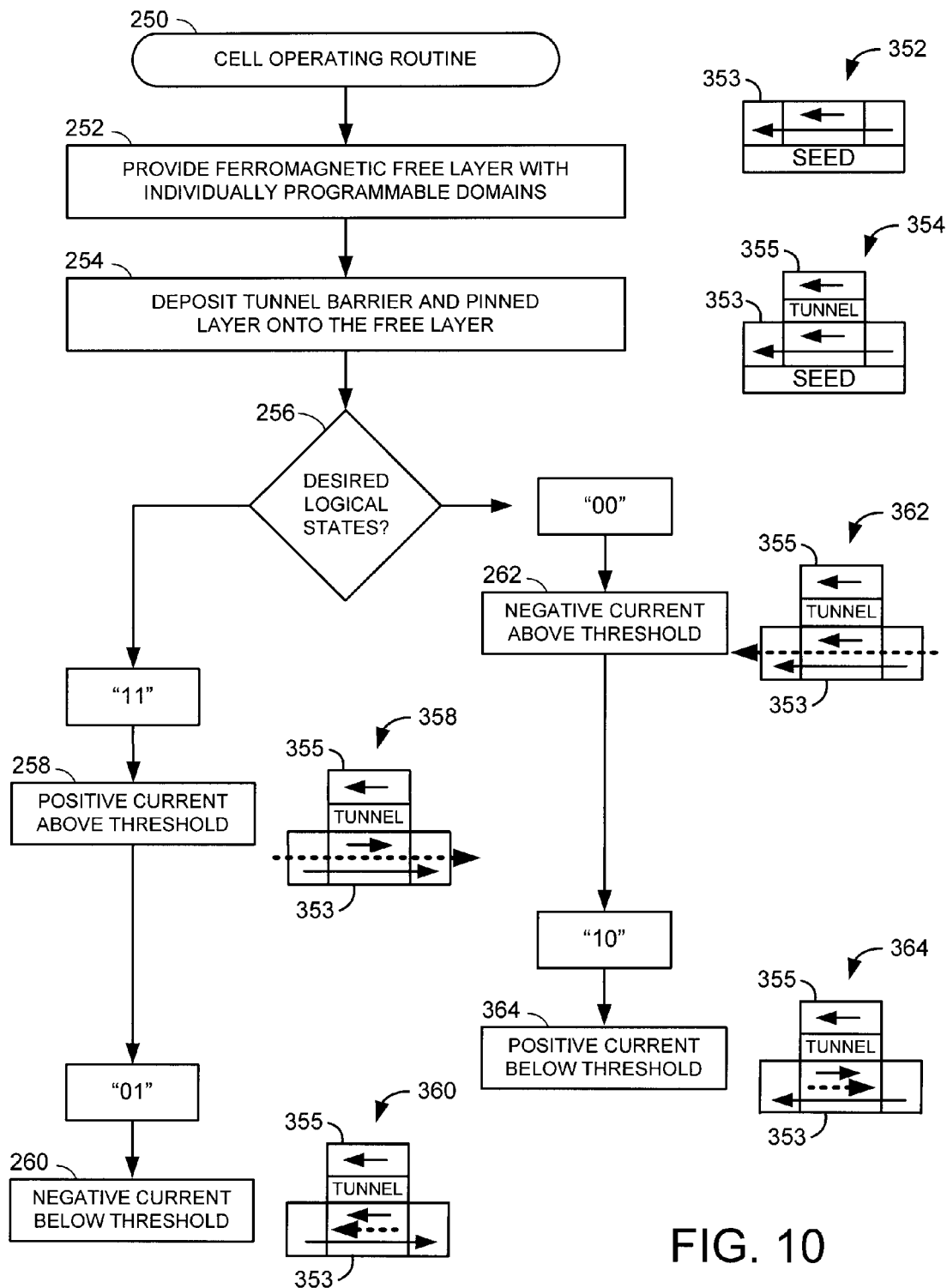
FIG. 10 displays a flow diagram and corresponding illustrative magnetic stacks of an exemplary CELL OPERATING routine conducted in accordance with the various embodiments of the present invention.

It should be noted that the programming routine 250 is not limited to the steps and corresponding exemplary memory cells shown in FIG. 10. The various steps can be modified or omitted while new steps can be added, as desired. For example, decision 256 can be repeated an indefinite amount of times for the same memory cell as logical states are continually programmed and reprogrammed. In another exemplary modification, all the positive and negative current conventions can be flipped so that a negative current produces a logical state of 1 while a negative state programs a logical state of 0.

As can be appreciated by one skilled in the art, the various embodiments illustrated herein provide advantages in both memory cell programming and reading efficiency. The ability to concurrently read and write two bits in a memory cell consequently requires less reading current. Moreover, the ability to selectively program one of the bits allows less programming current while increasing data capacity. However, it will be appreciated that the various embodiments discussed herein have numerous potential applications and are not limited to a certain field of electronic media or type of data storage devices.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A memory cell comprising a magnetic tunnel junction (MTJ) with a ferromagnetic free layer having multiple magnetic domains that are each independently programmable to predetermined magnetizations that are read as logical states of the MTJ.

2. The memory cell of claim 1, wherein a first domain is present in a first region of the free layer that is wider than a second region in which a second domain is present.

3. The memory cell of claim 2, wherein the first and second regions hold independent magnetic domains due to shape anisotropy.

4. The memory cell of claim 2, wherein the first region has a first width that transitions to a second width of the second region with a right angle notch.

5. The memory cell of claim 2, wherein the first region has a first width that transitions to a second width of the second region with a continuously curvilinear sidewall.

6. The memory cell of claim 1, wherein the MTJ has a pinned layer and tunnel junction have a width that is the same as a region of the free layer.

7. The memory cell of claim 2, wherein the first region has a magnetic coercivity that is less than the second region.

8. The memory cell of claim 1, wherein different predetermined magnetizations are programmed to the domains with different programming currents.

9. The memory cell of claim 2, wherein the first and second regions are laterally adjacent and each contact a tunnel junction layer.

10. The memory cell of claim 1, wherein the magnetic domains are read as resistances in parallel.

11. The memory cell of claim 2, wherein the first and second regions have continuously curvilinear sidewalls.

* * * * *